United States Patent
Han

(10) Patent No.: US 9,543,451 B2
(45) Date of Patent: Jan. 10, 2017

(54) HIGH VOLTAGE JUNCTION FIELD EFFECT TRANSISTOR

(71) Applicant: CSMC TECHNOLOGIES FAB1 CO., LTD., Jiangsu (CN)

(72) Inventor: Guangtao Han, Jiangsu (CN)

(73) Assignee: CSMC TECHNOLOGIES FAB1 CO., LTD., Jiangsu (CN)

( * ) Notice: Subject to any disclaimer, the term of this patent is extended or adjusted under 35 U.S.C. 154(b) by 0 days.

(21) Appl. No.: 14/407,599

(22) PCT Filed: Jun. 10, 2013

(86) PCT No.: PCT/CN2013/077119
§ 371 (c)(1),
(2) Date: Dec. 12, 2014

(87) PCT Pub. No.: WO2013/185604
PCT Pub. Date: Dec. 19, 2013

(65) Prior Publication Data
US 2015/0137192 A1 May 21, 2015

(30) Foreign Application Priority Data
Jun. 12, 2012 (CN) .......................... 2012 1 0192221

(51) Int. Cl.
*H01L 29/808* (2006.01)
*H01L 29/10* (2006.01)
(Continued)

(52) U.S. Cl.
CPC ......... *H01L 29/808* (2013.01); *H01L 29/1058* (2013.01); *H01L 29/1066* (2013.01);
(Continued)

(58) Field of Classification Search
USPC ........................................................ 257/285
See application file for complete search history.

(56) References Cited

U.S. PATENT DOCUMENTS 5,910,664 A * 6/1999 Ajit ..................... H01L 27/0716
257/139
6,037,238 A 3/2000 Chang et al.
(Continued)

FOREIGN PATENT DOCUMENTS

CN 101901805 A 12/2010
CN 101969072 A 2/2011
(Continued)

OTHER PUBLICATIONS

International Search Report dated Sep. 19, 2013.
Written Opinion of the International Searching Authority dated Sep. 19, 2013.

*Primary Examiner* — Zandra Smith
*Assistant Examiner* — Lawrence Tynes, Jr.
(74) *Attorney, Agent, or Firm* — Polsinelli PC

(57) ABSTRACT

The present invention discloses a high voltage JFET. The high voltage JFET includes a second conductivity type drift region located on the first conductivity type epitaxial layer; a second conductivity type drain heavily doped region located in the second conductivity type drift region; a drain terminal oxygen region located on the second conductivity type drift region and at a side of the second conductivity type drain heavily doped region; a first conductivity type well region located at a side of the second conductivity type drift region; a second conductivity type source heavily doped region and a first conductivity type gate heavily doped region located on the first conductivity type well region, and a gate source terminal oxygen region; a second conductivity type channel layer located between the second conductivity type source heavily doped region and the second conductivity type drift region; a dielectric layer and a field electrode plate located on the second conductivity type channel layer. Wherein a drain electrode electrically is led out from the second conductivity type drain heavily doped region; a (Continued)

source electrode electrically is led out from a connection of the field electrode plate and the second conductivity type source heavily doped region; and a gate electrode electrically is led out from the first conductivity type gate heavily doped region. The transistor has a high breakdown voltage and easy to be integrated.

6 Claims, 4 Drawing Sheets

(51) Int. Cl.
      *H01L 29/40*       (2006.01)
      *H01L 29/08*       (2006.01)
      *H01L 29/06*       (2006.01)

(52) U.S. Cl.
      CPC ........ *H01L 29/402* (2013.01); *H01L 29/0653* (2013.01); *H01L 29/0843* (2013.01)

(56) References Cited

U.S. PATENT DOCUMENTS

| | | |
|---|---|---|
| 8,207,580 B2 | 6/2012 | Parthasarathy et al. |
| 8,426,915 B2 | 4/2013 | Parthasarathy et al. |
| 2005/0104132 A1* | 5/2005 | Imoto ............. H01L 21/823892 257/369 |
| 2010/0301412 A1 | 12/2010 | Parthasarathy et al. |
| 2012/0306012 A1 | 12/2012 | Parthasarathy et al. |
| 2013/0134511 A1* | 5/2013 | Yang ..................... H01L 21/761 257/339 |
| 2013/0207192 A1 | 8/2013 | Parthasarathy et al. |

FOREIGN PATENT DOCUMENTS

| | | |
|---|---|---|
| EP | 2256816 A2 | 12/2010 |
| JP | 2010278436 A | 12/2010 |

* cited by examiner

HIGH VOLTAGE JUNCTION FIELD EFFECT TRANSISTOR

CROSS-REFERENCE TO RELATED APPLICATIONS

This application is a National Phase filing under 35 U.S.C. § 371 of PCT/CN2013/077119 filed on Jun. 10, 2013, which claims priority of Chinese Patent Application Ser. No. 201210192221.4 filed on Jun. 12, 2012 the entire contents of which are hereby incorporated by reference in their entireties.

FIELD OF THE INVENTION

The present invention relates to a device structure of a field effect transistor, and more particularly, relates to a JFET (Junction Field Effect Transistor) applied in high voltage, which belongs to a field of semiconductor producing.

BACKGROUND OF THE INVENTION

Field effect transistors are widely employed to design various simulation circuits, for example, applied to an amplifier circuit, a biasing circuit or a step-down circuit, a starting circuit, or a variable resistance, and so on. As an emerging demand for high voltage devices, how to improve breakdown voltage of various kinds of field effect transistors has become a design target of high voltage field effect transistor.

For MOSFET (Metal-Oxide-Semiconductor Field Effect Transistor), a DMOS (Double-diffused MOS) employing a planar diffusion technology is provided with characteristics such as a high current drive capacity, a low on-resistance, and a high breakdown voltage, such that DMOS is widely employed by power devices. Wherein, because LDMOS-FET (Lateral Double-diffused MOSFET) is more compatible with CMOS technology, such that DMOS is widely employed. Normally, the DMOS device is provided with a drift region between an active region and an drain region, and a impurity concentration of the drift region is relative low. When the LDMOS is connected to a high voltage, because the drift region has a high impendence, the drift region can withstand a relative high voltage. In addition, the polycrystalline layer or metal layer of the LDMOS extends above an oxygen region of the drift region, and serves as a field electrode plate, thereby weakening a surface electric field of the drift region, and benefiting for improving a breakdown voltage.

For JFET, it is different from the LDMOSFET, the drain electrode voltage of the JFET is applied to the PN junction of the drain electrode and the gate electrode, and the breaking point is normally located within the body, not on the surface. So the breakdown voltage of the JFET cannot be improved either by a filed electrode or by other types. So, the conventional JFET is limited by PN junction, and the breakdown voltage is about 20~30 volts, thereby limiting an application of JFET in high voltage field.

However, for emerging high voltage semiconductor integrated circuit technology, not only high voltage MOS transistor, but also high voltage JFET having high breakdown voltage and being compatible with CMOS/LDMOS integrated circuit producing technology are required, so as to meet a requirement of chips such as power management chips.

SUMMARY OF THE INVENTION

The technical problem to be solved by the present invention to provide a high voltage JFET having a high breakdown voltage and being compatible with CMOS/LDMOS integrated circuit.

In order to solve above technology problems, solutions are adopted by the present invention as follows:

A high voltage junction field effect transistor includes:
- a semiconductor substrate provided with a first conductivity type epitaxial layer;
- a second conductivity type drift region located on the first conductivity type epitaxial layer;
- a second conductivity type drain heavily doped region located in the second conductivity type drift region;
- a drain terminal oxygen region located on the second conductivity type drift region and at a side of the second conductivity type drain heavily doped region;
- a first conductivity type well region located at a side of the second conductivity type drift region, the first conductivity type well region being isolated from the second conductivity type drift region by the first conductivity type epitaxial layer;
- a second conductivity type source heavily doped region and a first conductivity type gate heavily doped region located on the first conductivity type well region, and a gate source terminal oxygen region being provided between the second conductivity type source heavily doped region and the first conductivity type gate heavily doped region to isolate the second conductivity type source heavily doped region from the first conductivity type gate heavily doped region;
- a second conductivity type channel layer located between the second conductivity type source heavily doped region and the second conductivity type drift region;
- a field electrode plate located on the second conductivity type channel layer, the field electrode plate extending to a part of the surface of the drain terminal oxygen region, a dielectric layer being provided between the field electrode plate and the second conductivity type channel layer, and also between the field electrode plate and the second conductivity type drift region;
- wherein a drain electrode electrically is led out from the second conductivity type drain heavily doped region; a source electrode electrically is led out from a connection of the field electrode plate and the second conductivity type source heavily doped region; and a gate electrode electrically is led out from the first conductivity type gate heavily doped region.

In a preferred embodiment, the second conductivity type channel layer is a second conductivity type implantation layer formed by ions implantation.

In a preferred embodiment, the field electrode plate is a polycrystalline layer or a metallic layer.

In a preferred embodiment, the high voltage field effect transistor is provided with a second conductivity type well region at opposite sides thereof, and a second conductivity type deep well region is provided beneath the first conductivity type epitaxial layer to isolate the high voltage field effect transistor.

In a preferred embodiment, a high voltage bearing structure is provided at a side of the second conductivity type drift region opposite to the first conductivity type well region.

In a preferred embodiment, the first conductivity type is P type, the second conductivity type is N type.

In a preferred embodiment, the first conductivity type is N type, the second conductivity type is P type.

A high voltage junction field effect transistor according to another embodiment, includes:
- a semiconductor substrate provided with a first conductivity type epitaxial layer;
- a second conductivity type drift region located on the first conductivity type epitaxial layer;
- a second conductivity type drain heavily doped region located in the second conductivity type drift region;
- two drain terminal oxygen regions located at opposite sides of the second conductivity type drain heavily doped region, and both positioned on the second conductivity type drift region;
- two first conductivity type well regions located at opposite sides of the second conductivity type drift region, and each first conductivity type well region being isolated from the second conductivity type drift region by the first conductivity type epitaxial layer;
- a second conductivity type source heavily doped region and a first conductivity type gate heavily doped region in each first conductivity type well region, a gate source terminal oxygen region being provided between the second conductivity type source heavily doped region and the first conductivity type gate heavily doped region to isolate the second conductivity type source heavily doped region from the first conductivity type gate heavily doped region;
- two first second conductivity type channel layers each located between one second conductivity type source heavily doped region and the second conductivity type drift region;
- two field electrode plates respectively located on the two second conductivity type channel layers, each field electrode plate extending to a part of the surface of corresponding drain terminal oxygen region, and a dielectric layer being provided between the field electrode plate and the second conductivity type channel layer, the dielectric layer also located between the field electrode plate and the second conductivity type drift region;
- wherein, a drain electrode electrically is led out from the two second conductivity type drain heavily doped region; a source electrode electrically is led out from connections of the two field electrode plates at opposite sides of the drain electrode and the two second conductivity type source heavily doped regions; and a gate electrode electrically is led out from a connection of the two first conductivity type gate heavily doped regions at opposite sides of the drain electrode.

In a preferred embodiment, the second conductivity type channel layer is a second conductivity type implantation layer formed by ions implantation.

In a preferred embodiment, the field electrode plate is a polycrystalline layer or a metallic layer.

In a preferred embodiment, the high voltage field effect transistor is provided with a second conductivity type well region at opposite sides thereof, and a second conductivity type deep well region is provided beneath the first conductivity type epitaxial layer to isolate the high voltage field effect transistor.

In a preferred embodiment, the first conductivity type is P type, the second conductivity type is N type.

In a preferred embodiment, the first conductivity type is N type, the second conductivity type is P type.

The high voltage JFET of the present invention draws the high voltage bearing structures of LDMOS for reference, and arranges the channel on an surface of the epitaxial layer, employing RESURF principle to greatly enhance a breakdown voltage of the JFET. The pinch-off voltage of the high voltage JFET can be adjusted by controlling the implantation conditions of the channel implantation layer. The producing technology of the high voltage JFET is compatible with conventional CMOS/LDMOS integrated circuit producing technology, so as to meet a requirement of high voltage semiconductor integrated circuit producing technology.

BRIEF DESCRIPTION OF THE DRAWINGS

The technical solutions of the present invention will be clearly and completely described in the following with reference to the accompanying drawings. It is obvious that the embodiments to be described are only a part rather than all of the embodiments of the present invention. All other embodiments obtained by persons skilled in the art based on the embodiments of the present invention without creative efforts shall fall within the protection scope of the present invention.

FIG. 1 is a schematic view of a high voltage JFET device according to another embodiment of the present invention;

DETAILED DESCRIPTION OF THE EMBODIMENTS

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by persons of ordinary skill in the art according to the embodiments of the present invention without creative efforts shall fall within the protection scope of the present invention.

As described in the background, as limited by PN junction, the breakdown voltage of the conventional JFET thereof is about 20~30 volts. In order to meet a requirement of high voltage semiconductor integrated circuit technology, the present invention provides a high voltage JFET adapted to a higher input voltage, and compatible with CMOS/LDMOS integrated circuit producing technology. The device structure is specifically described hereinafter with reference to drawings.

Figure 1:
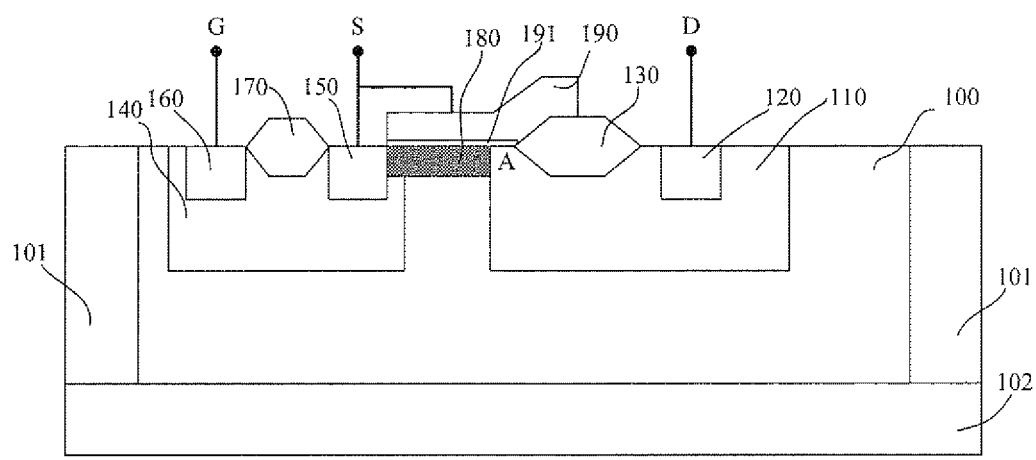
FIG. 1 is a schematic view of a high voltage JFET device according to an embodiment of the present invention.

Embodiment One:

Referring to FIG. 1, a high voltage JFET includes: a semiconductor substrate provided with a first conductivity type epitaxial layer 100; a second conductivity type drift region 110 located on the first conductivity type epitaxial layer 100; a second conductivity type drain heavily doped region 120 located in the second conductivity type drift region 110; a drain terminal oxygen region 130 located on the second conductivity type drift region 110 and at a side of the second conductivity type drain heavily doped region 120; a first conductivity type well region 140 located at a side of the second conductivity type drift region 110 and isolated from the second conductivity type drift region 110 by the first conductivity type epitaxial layer 100; a second conductivity type source heavily doped region 150 and a first conductivity type gate heavily doped region 160 located on the first conductivity type well region 140, a gate source terminal oxygen region 170 located between the second conductivity type source heavily doped region 150 and the first conductivity type gate heavily doped region 160 isolating above two regions 150, 160; a second conductivity type channel layer 180 located between the second conductivity type source heavily doped region 150 and the second conductivity type drift region 110; a field electrode plate 190 located on the second conductivity type channel layer 180, the field electrode plate 190 extending to a part of the surface of the drain terminal oxygen region 130, a dielectric layer 191 being provided between the field electrode plate 190 and the second conductivity type channel layer 180, and between the field electrode plate 190 and the second conductivity type drift region 110; a drain electrode D electrically led out from the second conductivity type drain heavily doped region 120; a source electrode S electrically led out from a connection of the field electrode plate 190 and the second conductivity type source heavily doped region 150; and a gate electrode G electrically led out from the first conductivity type gate heavily doped region 160.

When the first conductivity type is selected as P type, the second conductivity type is selected as N type, then the device is an N channel JFET. When the first conductivity type is selected as N type, the second conductivity type is selected as P type, then the device is a P channel JFET. The drain electrode D, the source electrode S, the gate electrode G can be led out from metal wiring, it is well known for a person skilled in the art, specific details are not described herein.

The gate electrode G is connected to the first conductivity type well region 140 via the first conductivity type gate heavily doped region 160, such that a depletion region between the first conductivity type well region 140 and the second conductivity type channel layer 180 can be affected by a gate electrode voltage, thereby controlling the current and on-off of the JFET. Preferably, the second conductivity type channel layer 180 is a second conductivity type implantation layer formed by ions implantation, the pinch-off voltage of the field effect transistor can be adjusted by controlling the implantation conditions.

The drain terminal of the JFET draws the high voltage bearing structures of LDMOS for reference, and is provided with the second conductivity type drift region 110, the drain terminal oxygen region 130, and the field electrode plate 190 extends to a part of the surface of the drain terminal oxygen region 130, and the channel is disposed on an surface of the epitaxial layer, employing RESURF principle to greatly enhance breakdown voltage of the JFET. The field electrode plate 190 can be a polycrystalline layer or a metallic layer. Preferably, in the embodiment, the field electrode plate 190 is a polycrystalline layer. The field electrode plate 190 is connected to the source electrode S to keep a same potential. Due to such metal wiring, the pinch-off voltage can be only controlled by the depletion region between the first conductivity type well region 140 and the second conductivity type channel layer 180. If the potential of the field electrode plate 190 is floating connected, the induction potential may cause a fluctuation of the pinch-off voltage. If the field electrode plate 190 is connected to the gate electrode G, i. e the first conductivity type well region 140, then a reverse biasing generated thereby is easy to exhaust charges of the second conductivity type drift region 110 on the portion A of FIG. 1, causing the pinch-off voltage to be out of control of the technology conditions of the second conductivity type channel layer 180, and transistor may enter cutoff region prematurely.

In addition, in order to isolate the device from the substrate, to meet the requirements of different designs. The high voltage field effect transistor may be provided with a second conductivity type well region 101 at opposite sides thereof, and a second conductivity type deep well regions 102 beneath the first conductivity type epitaxial layer 100, thereby forming an isolation structure to isolate the high voltage field effect transistor.

As a preferred solution of the embodiment, a high voltage is applied to the drain electrode D of the high voltage JFET, a high voltage bearing structure such as well regions with low concentration and large size, i. e conventional well isolation structures may be provided at a side of the second conductivity type drift region 110 opposite to the first conductivity type well region 140, thereby avoiding the affection to surrounding devices raised by the JFET when applied with high voltage.

Figure 2:
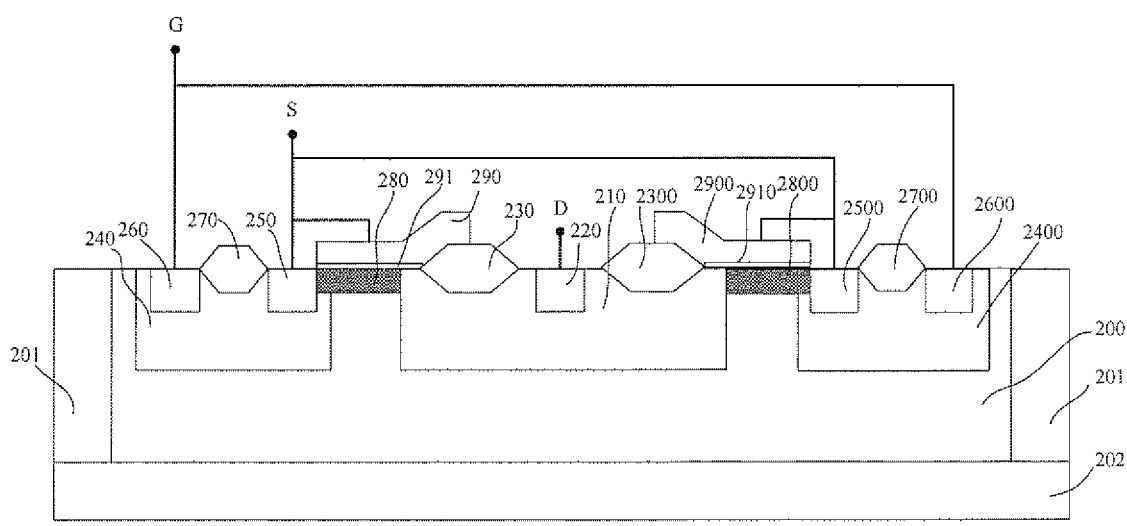

Embodiment Two:

referring to FIG. 2, another one high voltage JFET includes: a semiconductor substrate provided with a first conductivity type epitaxial layer 200; a second conductivity type drift region 210 located on the first conductivity type epitaxial layer 200; a second conductivity type drain heavily doped region 220 located in the second conductivity type drift region 210; a first drain terminal oxygen region 230 and a second drain terminal oxygen region 2300 located at opposite sides of the second conductivity type drain heavily doped region 220, and both the oxygen regions 230, 2300 being positioned on the second conductivity type drift region 210; a first first conductivity type well region 240 and a second first conductivity type well region 2400 located at opposite sides of the second conductivity type drift region 210, and both the well regions 240, 2400 being isolated from the second conductivity type drift region 210 by the first conductivity type epitaxial layer 200; a first second conductivity type source heavily doped region 260 and a first first conductivity type gate heavily doped region 250 located in the first first conductivity type well region 240, a first gate source terminal oxygen region 270 located between the first second conductivity type source heavily doped region 260 and a first first conductivity type gate heavily doped region 250 isolating above two heavily doped regions 260, 250; a second second conductivity type source heavily doped region 2600 and a second first conductivity type gate heavily doped region 2500 located in the second first conductivity type well region 2400, a second gate source terminal oxygen region 2700 located between a second second conductivity type source heavily doped region 2600 and a second first conductivity type gate heavily doped region 2500 isolating above two heavily doped regions 2600, 2500; a first second conductivity type channel layer 280 located between the first second conductivity type source heavily doped region 250 and the second conductivity type drift region 210; a second second conductivity type channel layer 2800 located between the second second conductivity type source heavily doped region 2500 and the second conductivity type drift region 210; a first field electrode plate 290 and a second polycrystalline field electrode plate 2900 respectively located on the first second conductivity type channel layer 280 and the second second conductivity type channel layer 2800, the field electrode plate 190 and the second field electrode plate 2900 respectively extending to a part of the surface of the first drain terminal oxygen region 230 and the second drain terminal oxygen region 2300, a first dielectric layer 291 is provided between the first field electrode plate 290 and the first second conductivity type channel layer 280, also between the first field electrode plate 290 and the second conductivity type drift region 210, a second dielectric layer 2910 is provided between the second field electrode plate 2900 and the second second conductivity type channel layer 2800, also between the second field electrode plate 2900 and the second conductivity type drift region 210; a drain electrode D electrically led out from the second conductivity type drain heavily doped region 220; a source electrode S electrically led out from connections of the field electrode plate 290 and the second field electrode plate 2900 at opposite sides of the drain electrode D, and the first second conductivity type source heavily doped region 250 and the second second conductivity type source heavily doped region 2500; and a gate electrode G electrically led out from a connection of the first second conductivity type source heavily doped region 260 and the second second conductivity type source heavily doped region 2600 at opposite sides of the drain electrode D.

When the first conductivity type is selected as P type, the second conductivity type is selected as N type, thus the device is a N channel JFET; When the first conductivity type is selected as N type, the second conductivity type is selected as P type, thus the device is a P channel JFET. The drain electrode D, the source electrode S, the gate electrode G can be led out from metal wiring, it is well known for a person skilled in the art, specific details are not described herein.

Preferably, both of the first second conductivity type channel layer 280 and the second second conductivity type channel layer 280 are second conductivity type implantation layers formed by ions implantation.

Preferably, the field electrode plate 190 can be a polycrystalline layer or a metal layer. In the embodiment, the field electrode plate 190 is a polycrystalline layer.

Preferably, the high voltage field effect transistor may be provided two second conductivity type well regions 201 at opposite sides thereof, and a second conductivity type deep well regions 202 beneath the first conductivity type epitaxial layer 200, thereby isolating the high voltage field effect transistor.

The difference between such structure and the JFET provided by embodiment one is that, opposite sides of the drain electrode D are equipped with active structures (source electrode and gate electrode), such design can avoid affections to surrounding devices raised by the JFET when applied with high voltage, it is not necessary to add a high voltage bearing structure additionally and saves chip surface area. Such double source terminals and gate terminals design also enhance the device performance.

In order to produce above JFET device, in addition to adding a photo-etching process and implanting a second conductivity type implantation layer to form channel region, other processes and producing conditions thereof are compatible with conventional CMOS/LDMOS integrated circuit producing technology.

In order to verify feasibility of the present solution, the device produced thereby undergoes a test.

Figure 3:
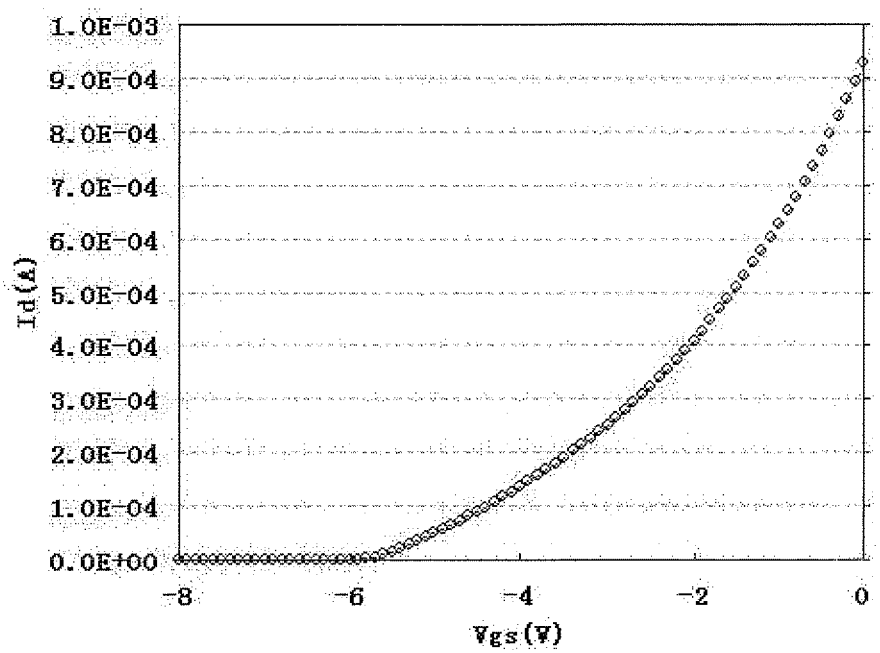
FIG. 3 is a characteristic graph of Id-Vgs of a high voltage JFET device according to another embodiment of the present invention.
Figure 4:
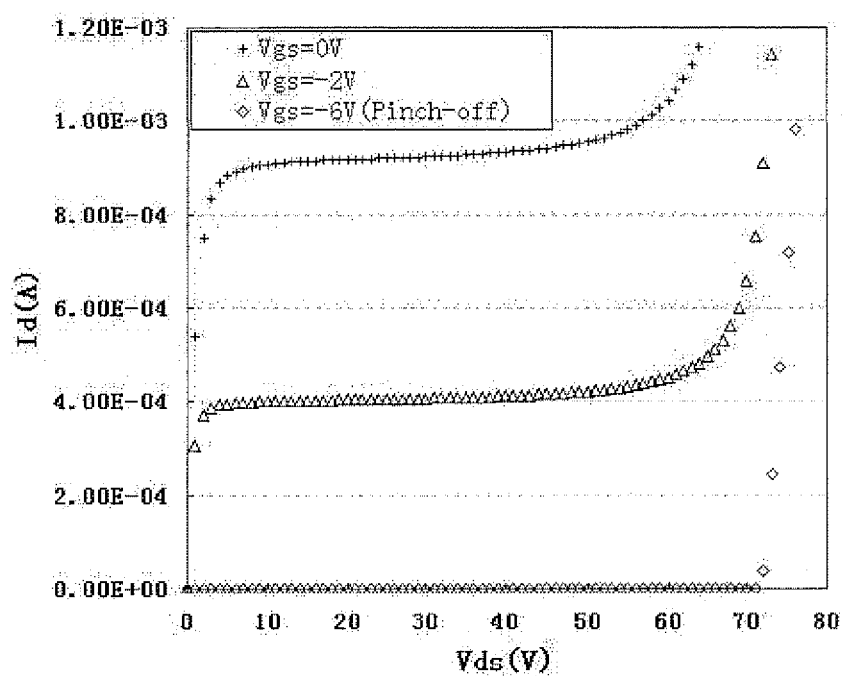
FIG. 4 is a characteristic graph of Id-Vds of a high voltage JFET device according to another embodiment of the present invention.

Referring to FIG. 3 and FIG. 4, FIG. 3 is a characteristic graph of drain electrode current-gate source voltage of Id-Vgs, FIG. 4 is a characteristic graph of drain electrode current-drain source electrode voltages of Id-Vds, the pinch-off voltage thereof is about −6 volts, the breakdown voltages thereof are all above 50 volts.

It shows that, the high voltage JFET provided by present invention not only meets a requirement of high voltage bearing, but also provides good JFET IV characters, and is compatible with CMOS/LDMOS integrated circuit producing technology, therefore it is easy for integration.

The disclosed embodiments described above, to enable the skilled in the art can implement or use the present invention. A variety of modifications of these embodiments, the field of professional skill will be apparent, as defined herein may be made without departing from the general principles of the spirit or scope of the present invention, the case of implementation in other embodiments. Accordingly, the present invention is not limited to the embodiments shown herein but to comply with the herein disclosed consistent with the principles and novel features of the widest range.

What is claimed is:

1. A high voltage junction field effect transistor, comprising:
   a semiconductor substrate provided with a first conductivity type epitaxial layer;
   a second conductivity type drift region located on the first conductivity type epitaxial layer;
   a second conductivity type drain heavily doped region located in the second conductivity type drift region;
   two drain terminal oxygen regions located at opposite sides of the second conductivity type drain heavily doped region, and both positioned on the second conductivity type drift region;
   two first conductivity type well regions located at opposite sides of the second conductivity type drift region, and each first conductivity type well region being isolated from the second conductivity type drift region by the first conductivity type epitaxial layer;
   a second conductivity type source heavily doped region and a first conductivity type gate heavily doped region in each first conductivity type well region, a gate source terminal oxygen region being provided between the second conductivity type source heavily doped region and the first conductivity type gate heavily doped region to isolate the second conductivity type source heavily doped region from the first conductivity type gate heavily doped region;
   two first second conductivity type channel layers each located between one second conductivity type source heavily doped region and the second conductivity type drift region;
   two field electrode plates respectively located on the two second conductivity type channel layers, each field electrode plate extending to a part of the surface of corresponding drain terminal oxygen region, and a dielectric layer being provided between the field electrode plate and the second conductivity type channel layer, the dielectric layer also located between the field electrode plate and the second conductivity type drift region;
   wherein, a drain electrode electrically is led out from the two second conductivity type drain heavily doped region; a source electrode electrically is led out from connections of the two field electrode plates at opposite sides of the drain electrode and the two second conductivity type source heavily doped regions; and a gate electrode electrically is led out from a connection of the two first conductivity type gate heavily doped regions at opposite sides of the drain electrode.

2. The high voltage junction field effect transistor according to claim 1, wherein the second conductivity type channel layer is a second conductivity type implantation layer formed by ions implantation.

3. The high voltage junction field effect transistor according to claim 1, wherein the field electrode plate is a polycrystalline layer or a metallic layer.

4. The high voltage junction field effect transistor according to claim 1, wherein the high voltage field effect transistor is provided with a second conductivity type well region at opposite sides thereof, and a second conductivity type deep well region is provided beneath the first conductivity type epitaxial layer to isolate the high voltage field effect transistor.

5. The high voltage junction field effect transistor according to claim 1, wherein the first conductivity type is P type, the second conductivity type is N type.

6. The high voltage junction field effect transistor according to claim 1, wherein the first conductivity type is N type, the second conductivity type is P type.

* * * * *